United States Patent
Tanabe et al.

(10) Patent No.: US 6,261,745 B1
(45) Date of Patent: *Jul. 17, 2001

(54) POST-ASHING TREATING LIQUID COMPOSITIONS AND A PROCESS FOR TREATMENT THEREWITH

(75) Inventors: Masahito Tanabe; Kazumasa Wakiya; Masakazu Kobayashi; Hiroshi Komano; Toshimasa Nakayama, all of Kanagawa-ken (JP)

(73) Assignee: Tokyo Ohka kogyo Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/323,988

(22) Filed: Jun. 2, 1999

(30) Foreign Application Priority Data

Jun. 5, 1998 (JP) .................................. 10-157791

(51) Int. Cl.$^7$ ....................................... G03F 7/40
(52) U.S. Cl. ........................... 430/331; 430/325; 510/176
(58) Field of Search .............................. 430/331; 510/176

(56) References Cited

U.S. PATENT DOCUMENTS

| 4,171,240 | 10/1979 | Wong | 156/630 |
|---|---|---|---|
| 4,944,893 | 7/1990 | Tanaka et al. | 252/171 |
| 5,308,745 | 5/1994 | Schwartzkopf | 430/329 |
| 5,792,274 | 8/1998 | Tanabe et al. | 134/1.3 |
| 5,905,063 | * 5/1999 | Tanabe et al. | 510/176 |
| 5,977,041 | * 11/1999 | Honda | 510/175 |

FOREIGN PATENT DOCUMENTS

| 0 773 480 | * 5/1997 | (EP) . |
| 0 827 188 | 3/1998 | (EP) . |
| 0 901 160 | 3/1999 | (EP) . |
| 64-73348 | 3/1989 | (JP) . |
| 3-205465 | 9/1991 | (JP) . |
| 7-64297 | 3/1995 | (JP) . |
| 8-202052 | 8/1996 | (JP) . |

* cited by examiner

*Primary Examiner*—Hoa Van Le
(74) *Attorney, Agent, or Firm*—Wenderoth, Lind & Ponack, LLP

(57) ABSTRACT

Disclosed herein is a post-ashing treating liquid composition comprising a salt of hydrofluoric acid with a base free from metal ions, a water-soluble organic solvent, water, and an acetylene alcohol/alkylene oxide adduct. Disclosed also herein is a process for treatment with said treating liquid composition. For removal of resist residues such as modified photoresist films and metal depositions, the treating liquid composition and the treating process can be advantageously applied to the substrates having been dry-etched, followed by ashing under severe conditions, without corrosion on metal layers and damage to an organic SOG layer formed thereon.

11 Claims, No Drawings

POST-ASHING TREATING LIQUID
COMPOSITIONS AND A PROCESS FOR
TREATMENT THEREWITH

BACKGROUND OF THE INVENTION

1. Field of the Invention

This invention relates to a post-ashing treating liquid composition and a process for treatment therewith. More particularly, the invention relates to a treating liquid composition which exhibits an excellent performance in treating a substrate having been dry-etched through a photoresist pattern formed thereon using as a mask pattern, followed by ashing, and it also relates to a process for treatment with the treating liquid composition. The treating liquid composition of the invention effectively removes residues, such as a modified or deteriorated photoresist film and metal depositions from a substrate with fine photoresist patterns formed thereon, which are remained or built up during etching and subsequent ashing. Moreover, it effectively protects from corrosion metal wiring, metal (oxide) layers, metal insulating layers deposited by CVD on the substrate. It also prevents organic SOG (spin on glass) layers from damage, such as poisoned via. The present invention is appropriately applicable to the production of semiconductor devices such as Ics, LSIs and liquid-crystal panel devices.

2. Description of Related Art

Semiconductor devices such as ICs and LSIs as well as liquid-crystal panel devices are fabricated by a process comprising the following steps: forming a conductive metallic layer or an insulating layer such as an $SiO_2$ film by CVD onto a substrate; applying a uniform photoresist layer over the metallic or insulating layer; selectively exposing the applied photoresist layer to light and developing the exposed layer to form a photoresist pattern; selectively etching the above-mentioned conductive metallic layer or insulating layer through the photoresist pattern as a mask pattern to form a fine-line circuit; and stripping away the remaining photoresist layer which is not necessary any longer. For the removal of such an unnecessary photoresist layer, a stripping agent that contains an organic amine as an essential ingredient, such as, for example, monoethanolamine, is commonly used today, because of its effectiveness in removing photoresists, and further for safety reasons.

As the metallic layer, use may be made of various ones, for example, aluminum (Al); an aluminum alloy (Al alloy), such as aluminum-silicon (Al—Si), aluminum-copper (Al—Cu) or aluminum-silicon-copper (Al—Si—Cu); titanium (Ti); a titanium alloy (Ti alloy), such as titanium nitride (TiN) or a titanium-tungsten system (TiW); tantalum (Ta); tantalum nitride (TaN); tungsten (W); or tungsten nitride (WN). One or more of such metallic layers are formed onto the substrate.

With the recent tendency toward high-density integrated circuits, dry etching enabling fine etching with a higher density has become the major means. Also, it has been a practice to employ plasma ashing to remove the unnecessary photoresist layers remained after etching. After etching, followed by ashing, residues of modified photoresist films and other components remain as referred to "veil" or "fences" on the bottom or side wall of patterned grooves. In addition, etching of metallic layers builds up metal depositions. Such residues and depositions should be completely removed so as to keep good yields in the production of semiconductors.

These residues and depositions vary in composition depending on the type of the etching gas employed, the ashing conditions, the type of the metallic layers and insulation layers formed on the substrate, the type of the photoresist employed, etc. In recent years, attempts have been made to improve semiconductors by various methods. As a result, the treating conditions in each step become strict and a great variety of metals, insulation layers and photoresits are employed therefor. Consequently, the residues and depositions become complicated, which make it difficult to identify those compositions. Under these circumstances, no satisfactory treating solution and treating method have been known so far.

In addition, a common way used recently to planarize the multilayer interconnected substrate is by forming one or more of thick organic SOG layer(s) on the substrate in place of conventional etch-back process. However, said organic SOG layer is liable to be corroded by water present in treating liquid compositions. Thus, there is an increasing demand for a treating liquid composition, which does not cause damage to the organic SOG layer.

There have been several solutions used for removal of modified photoresist films and for treatment after ashing. They are exemplarily disclosed in Unexamined Published Japanese Patent Application (Kokai) Nos. 202052/1996, 197681/1997, and 73348/1989.

Kokai No. 202052/1996 teaches a solution for resist removal that contains hydrofluoric acid, a salt thereof with a base free from metal ions, a water-soluble organic solvent, and an anticorrosive agent. Owing to hydrofluoric acid incorporated therein, the solution removes efficiently remove modified photoresist films and metal depositions remaining after ashing. However, it does not prevent satisfactorily corrosion on the apparatus near the solution feeder, damage to the organic SOG layer, and corrosion on metal layers and metal oxide layers.

Kokai No. 197681/1997 teaches a solution for resist removal which contains a salt of hydrofluoric acid with a base free from metal ions, and a water-soluble organic solvent, which has a pH of 5–8. This solution is an improved one of the solution disclosed in the above Kokai No. 202052/1996. The improvement is achieved by reducing the amount of hydrofluoric acid and hence adjusting the pH in the solution properly. Therefore, this solution corrodes less metal layers, metal oxide layers, and nearby-placed apparatus, and it damages less the organic SOG layer. However, it is not satisfactorily effective in removing residues left after fine patterning on substrates.

Kokai No. 73348/1989 teaches a solution for resist removal that contains an organic stripping solution and acetylene alcohol. This solution is for the use of removing photoresist during fabrication that does not include ashing process. It therefore cannot be used to remove resist residues such as modified photoresist film and metal depositions remaining after etching followed by ashing under severe conditions in fine patterning on substrates.

In view of the fact that the conventional treating liquid composition poses contradictory problems, that is, it corrodes metal layers and metal oxide layers and it damages the organic SOG layer if the content of hydrofluoric acid is high, while it does not remove residues completely if the content of hydrofluoric acid is low, the present inventors carried out extensive studies to minimize the effect of hydrofluoric acid. As a result, it was found that the problem is solved if a specific compound is added to a treating liquid composition containing hydrofluoric acid, a salt thereof with a base free from metal ions, and water. The present invention was completed on the basis of the findings.

SUMMARY OF THE INVENTION

An object, therefore, of the present invention is to provide a post-ashing treating liquid composition which exhibits excellent effects of treating substrates having been dry-etched under strict conditions followed by ashing, and also exerts favorable corrosion-inhibiting effects on the substrates provided with metallic layers. The treating liquid composition of the present invention is superior particularly in the removal of metal depositions from substrates with fine patterns formed thereon. In addition, it does not corrode metal layers and metal oxide layers, nor does it damage the organic SOG layer.

Another object of the present invention is to provide a treating process using the above-described post-ashing treating liquid composition.

Thus, according to one aspect of the invention, there is provided a post-ashing treating liquid composition, which comprises: (a) a salt of hydrofluoric acid with a base free from metal ions; (b) a water-soluble organic solvent; (c) water; and (d) an acetylene alcohol/alkylene oxide adduct.

According to another aspect of the invention, there is provided a process for treating substrates with the above-described treating liquid composition, said process comprising the steps of:
(I) forming a photoresist layer on a substrate having metallic layer(s) thereon;
(II) selectively exposing the photoresist layer to light;
(III) developing the light-exposed photoresist layer to provide a photoresist pattern;
(IV) etching the substrate through the photoresist pattern as a mask pattern to form a metallic wired pattern;
(V) ashing the photoresist pattern; and
(VI) treating the substrate, which has undergone etching followed by ashing, with the treating liquid composition.

DETAILED DESCRIPTION OF THE INVENTION

Component (a) in the treating liquid composition is a salt of hydrofluoric acid with a base free from metal ions. Preferred examples of the base free from metal ions include hydroxylamines; organic amines, such as primary, secondary, or tertiary aliphatic amines, alicyclic amines, aromatic amines and heterocyclic amines; aqueous ammonia; and lower-alkyl quaternary ammonium salts.

Examples of hydroxylamines include hydroxylamine ($NH_2OH$), N-methylhydroxylamine, N,N-dimethylhydroxylamine, and N,N-diethylhydroxylamine.

Examples of primary aliphatic amines include monoethanolamine, ethylenediamine, and 2-(2-aminoethylamino)ethanol.

Examples of secondary aliphatic amines include diethanolamine, dipropylamine, and 2-ethylaminoethanol.

Examples of tertiary aliphatic amines include dimethylamino-ethanol and ethyldiethanolamine.

Examples of alicyclic amines include cyclohexylamine and dicyclohexylamine.

Examples of aromatic amines include benzylamine, dibenzylamine, and N-methylbenzylamine.

Examples of heterocyclic amine include pyrrole, pyrrolidine, pyrrolidone, pyridine, morpholine, pyrazine, piperidine, N-hydroxyethylpiperidine, oxazole, and thiazole.

Examples of lower-alkyl quaternary ammonium salts include tetramethylammonium hydroxide (TMAH), tetraethylammonium hydroxide, tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, and (1-hydroxypropyl)trimethylammonium hydroxide.

Of these examples, aqueous ammonia, monoethanolamine, tetramethylammonium hydroxide, and (2-hydroxyethyl)trimethylammonium hydroxide are preferable because of their availability and safety.

The bases free from metal ions may be used alone or in combination with one another.

The salt of hydrofluoric acid with the base free from metal ions may be prepared using a commercially available hydrofluoric acid having a concentration of 50–60% and adding thereto the base free from metal ions in such an amount that the resulting solution has a pH of 5–8. Ammonium fluoride is the most desirable among the salts as component (a).

In the treating liquid composition, the amount of component (a) is preferably not more than 30 wt %, more preferably not more than 20 wt %; and is preferably not less than 0.2 wt %, more preferably not less than 0.5 wt %.

Component (b) in the treating liquid composition is a water-soluble organic solvent. It is not specifically restricted so long as it is miscible with other components.

Examples of water-soluble organic solvents include: sulfoxides, such as dimethyl sulfoxide; sulfones, such as dimethyl sulfone, diethyl sulfone, bis(2-hydroxyethyl) sulfone and tetramethylene sulfone; amides, such as N,N-dimethylformamide, N-methylformamide, N,N-dimethylacetamide, N-methylacetamide and N,N-diethylacetamide; lactams, such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones, such as 1,3-dimethyl-2-imidazolidinone, 1,3-diethyl-2-imidazolidinone and 1,3-diisoproyl-2-imidazolidinone; lactones, such as γ-butyrolactone and δ-valerolactone; and polyhydric alcohols, such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether and diethylene glycol monobutyl ether, and derivatives thereof. These organic solvents may be used alone or in combination with one another. Preferable among these examples are dimethylsulfoxide, N,N-dimethylformamide, N,N-dimethylacetamide, N-methyl-2-pyrrolidone, 1,3-dimethyl-2-imidazolidinone, ethylene glycol and diethylene glycol monobutyl ether, which effectively remove modified photoresist films. Of these examples, dimethyl sulfoxide is particularly desirable because of its good anticorrosive effect on substrates.

In the treating liquid composition, the amount of component (b) is preferably not more than 80 wt %, more preferably not more than 70 wt %; and is preferably not less than 30 wt %, more preferably not less than 40 wt %.

Component (c) in the treating liquid composition is water. Although some water is contained inevitably in component (b), etc., water is intentionally added according to the present invention.

Component (d) in the treating liquid composition is an acetylene alcohol/alkylene oxide adduct which is formed by adding alkylene oxide to acetylene alcohol.

The acetylene alcohol should preferably be one which is represented by the following general formula (I):

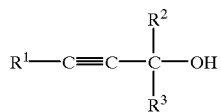
(I)

where $R^1$ is a hydrogen atom or

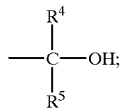

$R^2$, $R^3$, $R^4$ and $R^5$ are each independently a hydrogen atom or an alkyl group having 1–6 carbon atoms.

The alkyl group having 1–6 carbon atoms includes, for example, methyl group, ethyl group, propyl group, isopropyl group, butyl group, isobutyl group, sec-butyl group, tert-butyl group, pentyl group, isopentyl group, neopentyl group, tert-pentyl group, hexyl group, isohexyl group, 3-methylpentyl group, 2,2-dimethylbutyl group, and 2,3-dimethylbutyl group.

The acetylene alcohol is commercially available under trade names of "Surfynol" and "Olfin" series (both are products of Air Product and Chemicals Inc.). Of these commercial products, "Surfynol 104", "Surfynol 82", or mixtures thereof are most preferred for its physical properties. Other products such as "Olfin B", "Olfin P", and "Olfin Y" may also be preferred.

The alkylene oxide to be added to the acetylene alcohol is ethylene oxide, propylene oxide, or a mixture thereof.

Preferred compounds as component (d) are those which are represented by the following general formula (II):

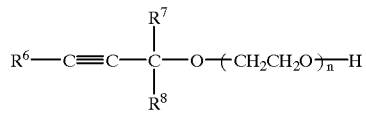
(II)

where $R^6$ is a hydrogen atom or

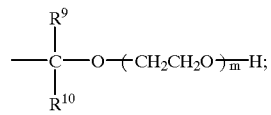

$R^7$, $R^8$, $R^9$, and $R^{10}$ are each independently a hydrogen atom or an alkyl group having 1–6 carbon atoms; (n+m) is an integer of 1 to 30, which is the number of ethylene oxide molecules added. This number subtly affects the water solubility and surface tension.

The compound as component (d) is known per se as a surfactant. It is commercially available under trade names of "Surfynol" series (products of Air Product and Chemicals Inc.) and "Acetylenol" series (products of Kawaken Fine Chemicals Co., Ltd.). Preferable among these products are "Surfynol 440" (n+m=3.5), "Surfynol 465" (n+m=10), "Surfynol 485" (n+m=30), "Acetylenol EL" (n+m=4), and "Acetylenol EH" (n+m=10), or mixtures thereof, in view of their water solubility and surface tension. A mixture of "Acetylenol EL" and "Acetylenol EH" in a ratio of from 2:8 to 4:6 (by weight) is particularly desirable.

Component (d) improves the penetrating properties and wetting properties of the treating liquid composition, so that the treating liquid composition spreads widely over the side walls of the patterned grooves. This is a possible reason why the treating liquid composition effectively remove residues and metal depositions from the bottom of the patterned grooves.

In the treating liquid composition, the amount of component (d) is preferably not more than 5 wt %, more preferably not more than 2 wt %; and is preferably not less than 0.1 wt %, more preferably not less than 0.15 wt %. With an amount more than specified above, component (d) causes foaming but produces no additional effects in improving wetting properties. With an amount less than specified above, component (d) does not produce the desired effects of improving wetting properties.

The treating liquid composition may be optionally incorporated with component (e) which is hydrofluoric acid. Component (e) should be added in an amount sufficient for the treating liquid composition to become nearly neutral (pH 5–8). An adequate amount of (e) is not more than 0.5 wt %. With an excess amount, component (e) makes the treating liquid composition so acidic as to vigorously corrode metal layers and metal oxide layers. With an amount not more than 0.1 wt %, component (e) permits the treating liquid composition to achieve its object of the removability of residues and metal depositions without corrosion on metal layers and metal oxide layers.

Further the treating liquid composition may be optionally incorporated with an anticorrosive agent, which has been used for conventional stripping solutions of organic amine type ones. A preferred anticorrosive agent is selected from the group consisting of aromatic hydroxyl compounds, acetylene alcohol, carboxyl group-containing organic compounds and anhydride thereof, triazole compounds, and sugars.

The post-ashing treating liquid composition of the present invention may be advantageously applied to use photoresists, including both negative- and positive-working photoresists which can be developed with an alkaline aqueous solution. Examples of these photoresists include; (i) a positive-working photoresist containing a naphthoquinone diazide compound and a novolac resin; (ii) a positive-working photoresist containing a compound which generates an acid upon light-exposure, a compound which is decomposed with an acid to become more soluble in an aqueous alkali solution and an alkali-soluble resin; (iii) a positive-working photoresist containing a compound which generates an acid upon light-exposure and an alkali-soluble resin containing groups that is decomposed with an acid to become more soluble in an aqueous alkali solution; and (iv) a negative-working photoresist containing a compound which generates an acid upon light-exposure, a crosslinking agent and an alkali-soluble resin; though the present invention is not restricted thereto.

A process for treating substrates with the above-mentioned treating liquid composition, said process comprising the steps of:
(I) forming a photoresist layer on a substrate having metallic layer(s) thereon;
(II) selectively exposing the photoresist layer to light;
(III) developing the light-exposed photoresist layer to provide a photoresist pattern;
(IV) etching the substrate through the photoresist pattern as a mask pattern to form a metallic wired pattern;
(V) ashing the photoresist pattern; and
(VI) treating the substrate, which has undergone etching followed by ashing, with the treating liquid composition.

These steps are explained specifically below:

The first step starts with providing a substrate of, for example, silicon wafer or glass with a metal layer or metal oxide layer by CVD or the like. It may optionally be formed on the substrate an insulation layer, such as $SiO_2$ film, and further, an organic SOG layer for flattening the layered-substrate. On the top of these layers is formed a photoresist layer.

As the metallic layer, use may be made of various ones, for example, aluminum (Al); an aluminum alloy (Al alloy), such as aluminum-silicon (Al—Si), aluminum-copper (Al—Cu) or aluminum-silicon-copper (Al—Si—Cu); pure titanium (Ti); a titanium alloy (Ti alloy), such as titanium nitride (TiN) or a titanium-tungsten system (TiW); tantalum (Ta); tantalum nitride (TaN); tungsten (W); or tungsten nitride (WN). One or more of such metallic layers are formed onto the substrate. When Al; an Al alloy, such as Al—Si, Al—Cu, Al—Si—Cu; Ti; a Ti alloy, such as TiN, TiW is used, residues and metal depositions are frequently adhered or built up after etching, followed by ashing in the patterned grooves. Accordingly, the treating liquid compositions of the present invention are particularly effective in removing these residues and metal depositions and in preventing the metallic layers from corrosion.

The SOG layer may be any known one. It is composed of a silicon oxide film, which is formed on a substrate from a coating material containing a silicon compound, and organic groups, such as lower alkyl groups ($CH_3$, etc.), bonded to silicon atoms in the silicon oxide film. The SOG layer is neither affected nor damaged by the treating liquid composition of the present invention.

Next, the photoresist layer is exposed to light and developed to form a photoresist pattern. The light-exposure and development conditions may be appropriately selected depending on the photoresist which is selected so as to attain the desired purpose. The light-exposure may be carried out by, for example, exposing the photoresist layer to light through a desired patterned mask with the use of a light source (for example, a low pressure mercury lamp, a high pressure mercury lamp, an ultra-high pressure mercury lamp, or a xenon lamp) capable of emitting active rays (for example, ultraviolet rays, far-ultraviolet rays, excimer lasers, X-rays, or electron beams). Alternatively, the photoresist layer is irradiated with electron beams under scanning. Subsequently, the photoresist layer is subjected to post-exposure baking, if necessary.

Next, patterning development is carried out by using a photoresist developer and thus the desired photoresist pattern can be obtained. The development may be effected by an arbitrary method without restriction. Use may be made of any method appropriate for the purpose: an immersion development method which comprises immersing the substrate having the photoresist applied thereonto in a developer for a definite time followed by washing with water and drying; a paddle development method which comprises dropping a developer onto the surface of the photoresist applied onto the substrate and allowing it to stand for a definite time followed by washing with water and drying; and a spray development method which comprises spraying a developer onto the surface of the photoresist followed by washing with water and drying.

Then, the above-mentioned conductive metallic layer or insulating layer is selectively etched by dry etching, etc. With the use of the photoresist pattern formed above as a mask to thereby give a fine-line circuit. Next, the unwanted photoresist layer is removed by plasma ashing. In this step, the substrate is contaminated, though in a small amount, with foreign matters, resist residues (i.e., the modified photoresist film) remaining after the ashing and metal depositions formed in the step of etching the metallic layer.

These residues and metal depositions are brought into contact with the above-mentioned treating liquid composition and thus removed from the substrate. Use of the above-mentioned treating liquid composition makes it possible to easily remove these residues such as the modified photoresist films and metal depositions. When the substrate having a metal such as Al or an Al alloy thereonto, in particular, an excellent corrosion-inhibiting effect is established on the substrate thereby.

After ashing, the substrate is treated with the liquid treating composition by, for example, a paddle method, a dip method or a shower method. The paddle method is a sheet-processing method which comprises dropping the treating liquid from a nozzle onto each substrate, thus bringing the substrate into contact with the treating liquid by taking advantage of surface tension for a definite time, and then rotating the substrate with a spinner, etc., thus splashing off the liquid. The dip method comprises immersing each wafer cassette in a tank filled up with the treating liquid for a definite time. The shower method comprises rotating each wafer cassette and spraying the treating liquid thereonto from a plural number of nozzles in a single direction.

The treating liquid composition of the present invention offers the advantage of causing no damage to the substrate having an organic SOG layer thereon without being etch-backed.

The invention will be described in more detail with reference to the following examples, which are not intended to restrict the scope thereof. Quantities in the formulation are expressed as wt %, unless otherwise stated.

EXAMPLES 1–6 AND COMPARATIVE EXAMPLES 1–4

On a silicon wafer were formed six layers sequentially as follows:

1st layer: Al—Si—Cu layer, about 400 nm thick;
2nd layer: Ti layer, about 30 nm thick;
3rd layer: TiN layer, about 30 nm thick;
4th layer: $SiO_2$ layer, about 300 nm thick, by plasma CVD;
5th layer: organic SOG layer, about 400 nm; and
6th layer: $SiO_2$ layer, about 500 nm thick, by plasma CVD.

The thus formed substrate was spin-coated with a positive-working photoresist comprising naphthoquinone diazide compound and novolak resin ("THMR-iP3300" of Tokyo Ohka Kogyo Co., Ltd.). Then, it was prebaked at 90° C. for 90 seconds, so that there was obtained a 0.2-$\mu$m thick photoresist layer. After that, the photoresist layer was exposed through a mask pattern using NSR-2005i10D (a product of Nikon Corporation). The exposed photoresist was developed with an aqueous solution of 2.38 wt % tetramethylammonium hydroxide (TMAH). The resulting photoresist pattern underwent post-baking at 120° C. for 90 seconds.

Subsequently, the substrate underwent etching by an etching apparatus (TSS-6000 of Tokyo Ohka Kogyo Co., Ltd.) with a mixed gas as an etchant of chlorine and boron trichloride at 5 mmTorr for 168 seconds, with the stable temperature kept at 20° C.

Etching was followed by "after corrosion treatment" in order to remove chlorine atoms with a mixed gas of oxygen and trifluoromethane at 20 mmTorr for 30 seconds, with the stage temperature kept at 20° C. Finally, the substrate underwent plasma ashing by an ashing apparatus (TCA-3822 of Tokyo Ohka Kogyo Co., Ltd.) at 1.2 mmTorr for 40 seconds, with the stage temperature kept at 220° C.

The substrate, which had undergone plasma ashing as mentioned above, was treated with the treating liquid composition shown in Table 1 and then examined for removal of metal depositions, corrosion of metallic layers, and damage to organic SOG layer as follows. The results are shown in Table 1. No significant difference was observed among examples in removal of modified photoresist.

[Removal of Metal Depositions]

The substrate was dipped in the treating liquid composition at 23° C. for 5 minutes and then rinsed with pure water. The treated and rinsed substrate was observed by an SEM (scanning electron microscope) to see how metal depositions were removed. Results were rated according to the following criteria.

◯: metal depositions were completely removed;
Δ: metal depositions remained slightly;
×: metal depositions remained considerably.

[Corrosion on Metallic Layers]

The substrate was dipped in the treating liquid composition at 23° C. for 10 minutes. The treated substrate was observed by an SEM (scanning electron microscope) to see how metallic layers were corroded. Results were rated according to the following criteria.

◯: no corrosion;
×: corrosion.

[Damage to Organic SOG Layer]

The substrate was dipped in the treating liquid composition at 23° C. for 10 minutes. The treated substrate was observed by an SEM (scanning electron microscope) to see how the organic SOG layer was damaged. Results were rated according to the following criteria.

◯: no damage;
×: damage.

TABLE 1

| | | Ex. 1 | Ex. 2 | Ex. 3 | Ex. 4 | Ex. 5 | Ex. 6 | Comp. Ex. 1 | Comp. Ex. 2 | Comp. Ex. 3 | Comp. Ex. 4 |
|---|---|---|---|---|---|---|---|---|---|---|---|
| Composition of treating liquid composition (wt %) | Ammonium fluoride | 1 | 1 | 1 | 1 | 1 | 1 | 1 | 1 | 1 | 1 |
| | Hydrofluoric acid | — | — | — | — | — | — | 0.05 | — | — | — |
| | Acetylene alcohol/alkylene oxide adduct(*) | 0.1 | 0.2 | 0.2 | 0.2 | 1 | 3 | — | — | — | — |
| | Water | 30 | 30 | 30 | 30 | 30 | 30 | 30 | 30 | 30 | 30 |
| | Water-soluble organic solvent | DMSO balance | DMF balance | NMP balance | DMSO balance | DMSO balance | DMSO balance | DMSO balance | DMSO balance | DMSO balance | DMSO balance |
| Rating | Removal of metal depositions | Δ | ◯ | ◯ | ◯ | ◯ | ◯ | ◯ | × | × | × |
| | Corrosion on metallic layers | ◯ | ◯ | ◯ | ◯ | ◯ | ◯ | × | ◯ | ◯ | ◯ |
| | Damage to organic SOG layer | ◯ | ◯ | ◯ | ◯ | ◯ | ◯ | × | ◯ | ◯ | ◯ |

Note:
Acetylene alcohol/alkylene oxide adduct(*):3:7 mixture of "Acetylenol EL" and "Acetylenol EH" (by weight)

TABLE 1-continued

|  | Ex. 1 | Ex. 2 | Ex. 3 | Ex. 4 | Ex. 5 | Ex. 6 | Comp. Ex. 1 | Comp. Ex. 2 | Comp. Ex. 3 | Comp. Ex. 4 |
|---|---|---|---|---|---|---|---|---|---|---|

DMSO: Dimethylsulfoxide;
DMF: N,N-dimethylformamide;
NMP: N-methyl-2-pyrrolidone;

EXAMPLE 7

On a silicon wafer were formed four layers sequentially as follows:

1st layer: Al—Si—Cu layer, about 400 nm thick;

2nd layer: Ti layer, about 30 nm thick;

3rd layer: TiN layer, about 30 nm thick; and

4th layer: SiO$_2$ layer, about 300 nm thick, by plasma CVD.

The thus formed substrate underwent patterning, etching, and ashing in the same manner as in Examples 1 to 6.

Subsequently, the substrate was dipped in a treating liquid composition of 0.1 wt % of ammonium fluoride, 0.1 wt % of acetylene alcohol/alkylene oxide adduct (3:7 mixture of "Acetylenol EL" and "Acetylenol EH" (by weight), 0.05 wt % of hydrofluoric acid, 30 wt % of water, and DMSO of being balance, at 23° C. for 5 minutes for removal of metal depositions.

After rinsing with pure water, the treated substrate was observed by an SEM (scanning electron microscope) to see how metal depositions were removed. It was found that metal depositions were removed completely.

The substrate, which had undergone ashing, was dipped in the above-mentioned treating liquid composition at 23° C. for 10 minutes. The treated substrate was observed by an SEM (scanning electron microscope) to see how metallic layers were corroded. It was found that no corrosion occurred at all.

According to the present invention as detailed above, the treating liquid composition and the process for treatment with this treating liquid composition can be advantageously applied to the substrates which have undergone dry etching and ashing under severe conditions, without corrosion on metallic layers formed thereon. The treating liquid composition of the present invention can effectively remove metal depositions from the substrates having fine patterns formed thereon. In addition, it can be applied to the substrate without causing damage to the organic SOG layer formed thereon.

What is claimed is:

1. A post-ashing treating liquid composition which comprises (a) a salt of hydrofluoric acid with a base free from metal ions; (b) a water-soluble organic solvent; (c) water; and (d) an acetylene alcohol/alkylene oxide adduct.

2. The post-ashing treating liquid composition according to claim 1, wherein the acetylene alcohol constituting component (d) is a compound represented by the following general formula (I):

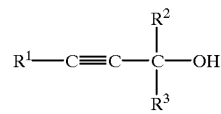

(I)

where R$^1$ is a hydrogen atom or

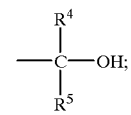

R$^2$, R$^3$, R$^4$ and R$^5$ are each independently a hydrogen atom or an alkyl group having 1–6 carbon atoms.

3. The post-ashing treating liquid composition according to claim 1, wherein the alkylene oxide constituting component (d) is ethylene oxide, propylene oxide or a mixture thereof.

4. The post-ashing treating liquid composition according to claim 1, wherein the base free from metal ions constituting component (a) is at least one member selected from the group consisting of hydroxylamines, primary, secondary, or tertiary aliphatic amines, alicyclic amines, aromatic amines, heterocyclic amines, aqueous ammonia, and lower-alkyl quaternary ammonium salts.

5. The post-ashing treating liquid composition according to claim 1, wherein component (a) is ammonium fluoride.

6. The post-ashing treating liquid composition according to claim 1, wherein component (b) is at least one member selected from the group consisting of dimethyl sulfoxide, N,N-dimethylformamide, N,N-dimethylacetamide, N-methyl-2-pyrrolidone, 1,3-dimethyl-2-imidazolidinone, ethylene glycol, and diethylene glycol monobutyl ether.

7. The post-ashing treating liquid composition according to claim 1, wherein the composition comprises 0.2–30 wt % of component (a); 30–80 wt % of component (b); and 0.1–5 wt % of component (d), with the balance being component (c).

8. The post-ashing treating liquid composition according to claim 1, which further includes (e) hydrofluoric acid.

9. The post-ashing treating liquid composition according to claim 8, wherein the composition comprises 0.2–30 wt % of component (a); 30–80 wt % of component (b); 0.1–5 wt % of component (d), and 0.5 wt % or less of component (e), with the balance being component (c).

10. A process for treating substrates with the treating liquid composition defined in claim 1, said process comprising the steps of:
(I) forming a photoresist layer on a substrate having metallic layer(s) thereon;
(II) selectively exposing the photoresist layer to light;
(III) developing the light-exposed photoresist layer to provide a photoresist pattern;
(IV) etching the substrate through the photoresist pattern as a mask pattern to form a metallic wired pattern;
(V) ashing the photoresist pattern; and
(VI) treating the substrate, which has undergone etching followed by ashing, with the treating liquid composition.

11. The process according to claim 10, wherein the substrate has thereon at least an organic SOG layer.

* * * * *